United States Patent
Maekawa

[11] Patent Number: 5,164,614
[45] Date of Patent: Nov. 17, 1992

[54] LOW POWER BIAS VOLTAGE GENERATING CIRCUIT COMPRISING A CURRENT MIRROR

[75] Inventor: Itaru Maekawa, Kanagawa, Japan
[73] Assignee: Sony Corporation, Tokyo, Japan
[21] Appl. No.: 727,930
[22] Filed: Jul. 10, 1991
[30] Foreign Application Priority Data Jul. 11, 1990 [JP] Japan .................. 2-181654

[51] Int. Cl.[5] ............................ H03K 3/354
[52] U.S. Cl. ................. 307/296.1; 307/296.2; 307/296.5; 307/296.6; 323/215
[58] Field of Search ............ 307/296.1, 296.2, 296.6, 307/296.5; 323/115, 116, 117

[56] References Cited

U.S. PATENT DOCUMENTS

| | | | |
|---|---|---|---|
| 4,477,737 | 10/1984 | Ulmer et al. | 307/296.6 |
| 4,792,705 | 12/1988 | Ouyang et al. | 307/296.2 |
| 4,965,510 | 10/1990 | Kriedt et al. | 307/296.6 |
| 4,978,868 | 12/1990 | Giordano et al. | 307/296.6 |
| 5,029,282 | 6/1991 | Ito | 307/296.2 |
| 5,059,890 | 10/1991 | Yoshikawa et al. | 307/296.1 |

Primary Examiner—Stanley D. Miller
Assistant Examiner—Scott A. Ouellette
Attorney, Agent, or Firm—Hill, Van Santen, Steadman & Simpson

[57] ABSTRACT

A bias voltahe generating circuit which is low in power consumption and small in chip size of an IC and does not pickup noises readily. The bias voltage generating circuit comprises a current mirror circuit including a diode-connected first transistor of a first conduction type and second and third transistors of the first conduction type, and bias voltage generating fourth and fifth transistors of a different second conduction type having input electrodes connected to output electrodes of the second and third transistors, respectively. The first to third transistors and the fourth and fifth transistors are formed on a single chip semiconductor substrate as a semiconductor integrated circuit. The bias voltage generating circuit further comprises a resistor provided outside the integrated circuit and connected to an input electrode of the first transistor, and a predetermined bias current is supplied to the first transistor through the resistor. Also an improved operational amplifier circuit which is low in power consumption and small in chip size of an IC and does not pickup noises readily is disclosed and incorporates such bias voltage generating circuit.

2 Claims, 3 Drawing Sheets

LOW POWER BIAS VOLTAGE GENERATING CIRCUIT COMPRISING A CURRENT MIRROR

BACKGROUND OF THE INVENTION

1. Field of the Invention

This invention relates to a bias voltage generating circuit and an operational amplifier circuit, and more particularly to a bias voltage generating circuit and an operational amplifier circuit by which a plurality of bias voltages can be set at the same time with a resistor which is provided outside a semiconductor integrated circuit (IC).

2. Description of the Prior Art

An operational amplifier circuit which employs a MOS FET (insulating gate type field effect transistor) is conventionally known and disclosed, for example, in Japanese Patent Laid-Open Application No. 62-68308.

Referring to FIG. 3, there is shown an exemplary one of conventional operational amplifier circuits. The operational amplifier circuit shown includes a pair of N-channel MOS FETs $Q_A$ and $Q_B$ for differential amplification, and a pair of P-channel MOS FETs $Q_C$ and $Q_D$ which are connected to the drains of the differential amplification MOS FETs $Q_A$ and are $Q_B$ and constructed as a current mirror circuit. The operational amplifier circuit further includes an N-channel MOS FET $Q_E$ for level shifting. The MOS FET $Q_E$ is provided to drive a P-channel MOS FET $Q_F$ and an N-channel MOS FET $Q_G$ which are push-pull connected to each other by an output of the drain of the MOS FET $Q_B$ and an output of the source of the N-channel MOS FET $Q_E$. The operational amplifier further includes an N-channel MOS FET $Q_H$ for generation of a bias voltage. The MOS FET $Q_H$ is connected between power source terminals $+V$ and $-V$ by way of a P-channel MOS FET $Q_I$ and an N-channel MOS FET $Q_J$ which are connected in series as a resistor. A pair of N-channel MOS FET transistors $Q_K$ and $Q_L$ form a constant-current source and are commonly biased by the bias voltage generator N-channel MOS FET $Q_H$.

Since the resistance value of the P-channel MOS FET $Q_I$ and N-channel MOS FET $Q_J$ which are connected in series as a resistor disperses about $\pm 20$ to $\pm 30\%$ when they are constituted as an IC, their operating current must necessarily be set high, and as a result, there is high power consumption which is undesirable.

Meanwhile, in case such operational amplifier circuit is provided with a plurality of channels and the N-channel MOS FET transistors $Q_K$ and $Q_L$ are individually biased by the operational amplifiers, since the voltage lines are drawn between the bias voltage generation N-channel MOS FETs $Q_H$ and the constant-current source transistors $Q_K$ and $Q_L$ noise is readily picked up. Besides, since the N-channel MOS FETs $Q_J$ and $Q_H$ and the P-channel MOS FETs $Q_I$ for generation of a bias voltage are separately provided. A large chip size is required for the IC which is undesirable.

SUMMARY OF THE INVENTION

Accordingly, it is an object of the present invention to provide a bias voltage generating circuit which has low power consumption and which can be formed as a small chip IC and which does not readily pickup noise.

It is another object of the present invention to provide an operational amplifier which is low in power consumption and is a small chip IC and which does not readily pickup noise.

In order to attain these objects, according to one aspect of the present invention, there is provided a bias voltage generating circuit which comprises a current mirror circuit including a diode-connected first transistor of a first conduction type and second and third transistors of the first conduction type which are connected to the first transistor in an diode-connected manner. Bias voltage generating fourth and fifth transistors are of a second conduction type which is different from the first conduction type, the fourth and fifth transistors having input electrodes which are connected to the output electrodes of the second and third transistors of the current mirror circuit, respectively. The first, second and third transistors of the current mirror circuit and the bias voltage generating fourth and fifth transistors are formed on a single chip semiconductor substrate as a semiconductor integrated circuit. The integrated circuit has an input terminal which are connected to an input electrode of the first transistor. A resistor is provided outside the integrated circuit and is connected to the input terminal for supplying a predetermined bias current to the input terminal of the integrated circuit.

With the bias voltage generating circuit, the resistor for supplying the predetermined bias current therethrough is provided outside the semiconductor substrate of the integrated circuit and the possible dispersion of the resistor is decreased, and consequently, the bias current value can be set accurately and the bias output voltages of the fourth and fifth transistors can be set at the same time by the resistance value of the resistor. Further, since a bias constant current flows between the current mirror circuit and the bias voltage generating fourth and fifth transistors, the degree of freedom of the layout is increased and the noise can be decreased.

According to another aspect of the present invention, there is provided an operational amplifier circuit which comprises a bias voltage generating circuit including a current mirror circuit which includes a diode-connected first transistor of a first conduction type and second and third transistors of the first conduction type which are connected to the first transistor. The bias voltage generating circuit further includes diode-connected, bias voltage generating fourth and fifth transistors of a second conduction type which is different from the first conduction type. The fourth and fifth transistors have input electrodes which are connected to output electrodes of the second and third transistors of the current mirror circuit, respectively. The first, second and to third transistors of the current mirror circuit and the bias voltage generating fourth and fifth transistors are formed on a single chip semiconductor substrate as a semiconductor integrated circuit. The integrated circuit has an input terminal which is connected to an input electrode of the first transistor. The bias voltage generating circuit further including a resistor which is provided outside the integrated circuit and is connected to the input terminal for supplying a predetermined bias current therethrough to the input terminal of the integrated circuit. A first operational amplifier includes a constant-current source transistor which is connected so as to be biased by a drop voltage of the fourth transistor. A second operational amplifier including a constant-current source transistor is connected to be biased by a drop voltage of the fifth transistor, the first and second operational amplifiers being formed on the single chip semiconductor substrate.

With the operational amplifier circuit, the operating currents of the operational amplifiers can be set at the same time accurately by means of the resistor of the bias voltage generating circuit provided outside the semiconductor substrate of the integrated circuit. Further, since a bias constant current flows between the current mirror circuit and the bias voltage generating fourth and fifth transistors, the degree of freedom in layout against noises is increased.

The above and other objects, features and advantages of the present invention will become apparent from the following description and the appended claims, taken in conjunction with the accompanying drawings in which like parts or elements are denoted by like reference characters.

DETAILED DESCRIPTION OF THE PREFERRED EMBODIMENT

Figure 1:
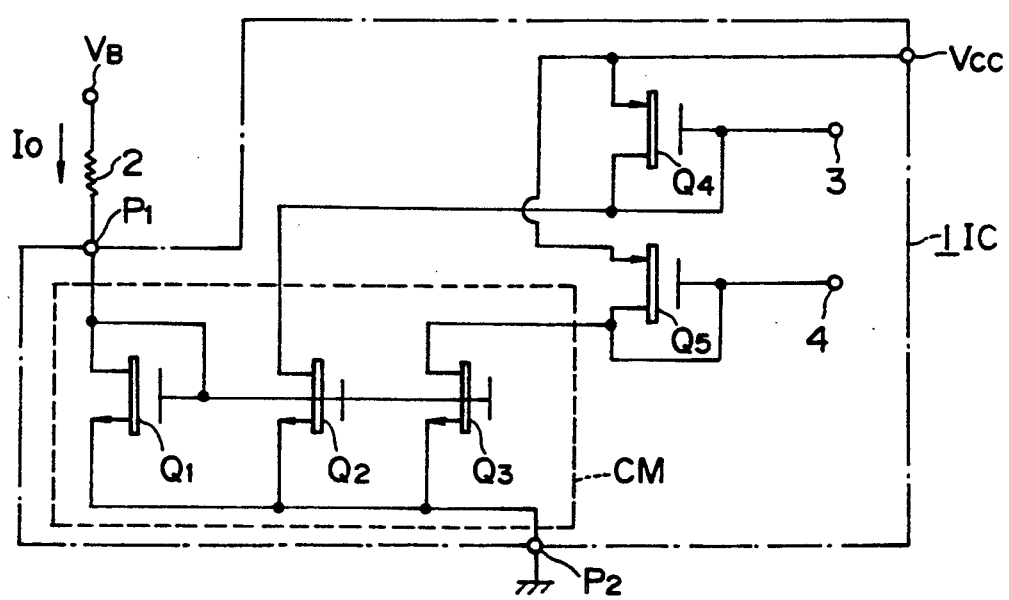
FIG. 1 is a circuit diagram showing a bias voltage generating circuit to which the present invention is applied.

Referring first to FIG. 1, there is shown a bias voltage generating circuit to which the present invention is applied. The bias voltage generating circuit shown includes an IC (integrated circuit) 1 formed on a single chip semiconductor substrate not shown. The IC 1 includes a diode-connected first transistor $Q_1$ of a first conduction type which may be, for example, an N-channel MOS FET, and second and third transistors $Q_2$ and $Q_3$ of the first conduction type which may also be, for example, N-channel MOS FETs. The first transistor $Q_1$ and the second and third transistors $Q_2$ and $Q_3$ are connected in parallel between the gates and the sources thereof to each other to constitute a current mirror circuit CM. The IC 1 further includes diode-connected fourth and fifth transistors $Q_4$ and $Q_5$ for generation of a bias voltage of a second conduction type different from the first conduction type. The fourth and fifth transistors $Q_4$ and $Q_5$ may be, for example, P-channel MOS FETs and have input electrodes connected between a power source terminal Vcc and output electrodes (drains) of the second and third transistors $Q_2$ and $Q_3$, respectively, of the current mirror circuit CM. The fourth and fifth transistors $Q_4$ and $Q_5$ are formed on the single chip semiconductor substrate together with the first to third transistors $Q_1$ to $Q_3$ of the current mirror circuit CM.

The bias voltage generating circuit further includes a resistor 2 connected between a power source terminal $V_B$ and a pin $P_1$ of the IC 1 for supplying a predetermined bias current to the IC 1 therethrough by way of the pin 1. Another pin $P_2$ of the IC 1 is connected to the sources of the first to third transistors $Q_1$ to $Q_3$ of the current mirror circuit CM and also is grounded. The bias voltage generating circuit has first and second output terminals 3 and 4 connected to the gates of the fourth and fifth transistors $Q_4$ and $Q_5$, respectively.

In the bias voltage generating circuit described above, a bias current $I_0$ flowing through the resistor 2 is multiplied by the current mirror circuit CM and flows through the fourth and fifth transistors $Q_4$ and $Q_5$ to produce predetermined bias voltages at the first and second output terminals 3 and 4. Here, the resistor 2 for supplying the bias current $I_0$ therethrough is provided outside the IC 1. Consequently, a possible dispersion of the resistor 2 is reduced, and accordingly, the bias current $I_0$ can be set accurately.

Figure 2:
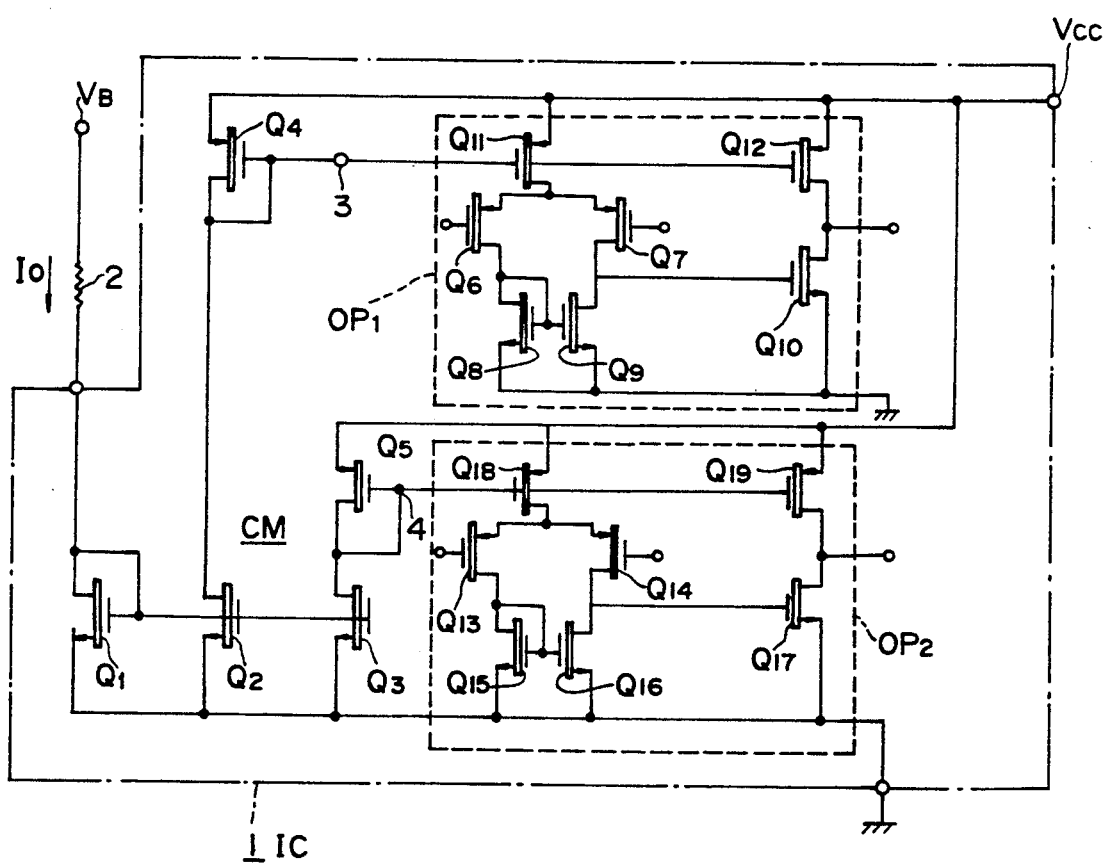
FIG. 2 is a circuit diagram showing an operational amplifier circuit to which the present invention is applied.
Figure 3:
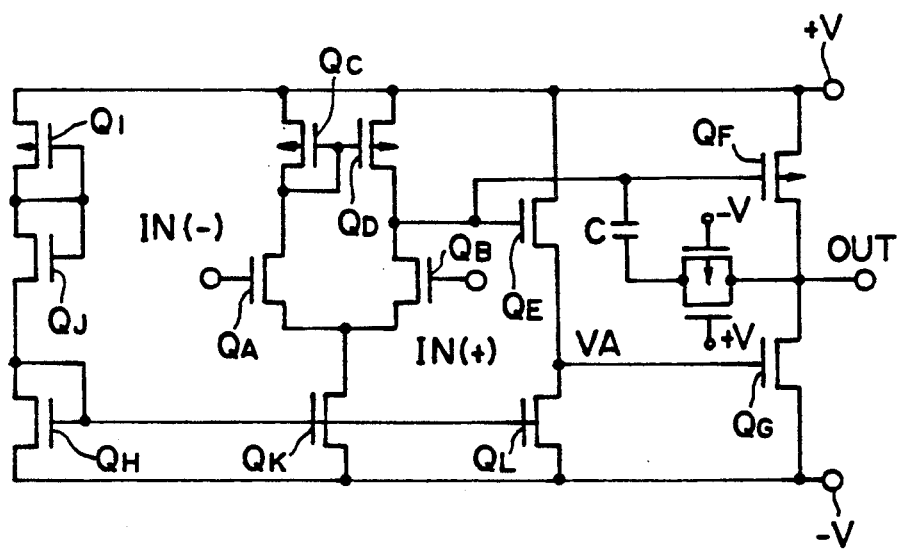
FIG. 3 is a circuit diagram showing an exemplary one of conventional operational amplifier circuits.

Referring now to FIG. 2, there is shown an operational amplifier circuit to which the present invention is applied. The operational amplifier circuit employs such bias voltage generating circuit as described above. In particular, the operational amplifier circuit shown includes first and second operational amplifiers $OP_1$ and $OP_2$ connected to the first and second output terminals 3 and 4, respectively, of the bias voltage generating circuit described above. The first and second operational amplifiers $OP_1$ and $OP_2$ are formed on the IC 1 together with the bias voltage generating circuit. The first operational amplifier $OP_1$ includes a pair of N-channel MOS FETs $Q_6$ and $Q_7$ for differential amplification, and another pair of N-channel MOS FETs $Q_8$ and $Q_9$ and a further N-channel MOS FET $Q_{10}$ for amplification which are constructed as a current mirror circuit connected to the drains of the differential amplification MOS FETs $Q_6$ and $Q_7$. The first operational amplifier $OP_1$ further includes a pair of P-channel MOS FETs $Q_{11}$ and $Q_{12}$ for a constant-current source, to which a bias voltage of the first output terminal 3 of the bias voltage generating circuit is supplied.

The second operational amplifier $OP_2$ has MOS FETs $Q_{13}$ to $Q_{19}$ connected in a similar manner as the MOS FETs $Q_6$ to $Q_{12}$ of the first operational amplifier $OP_1$. Here, a bias voltage of the second output terminal 3 of the bias voltage generating circuit is supplied to the P-channel MOS FETs $Q_{18}$ and $Q_{19}$ for a constant-current source.

In the operational amplifier circuit of the construction just described, the constant-current source transistors $Q_{11}$, $Q_{12}$ and $Q_{18}$, $Q_{19}$ of the operational amplifiers $OP_1$ and $OP_2$ are connected in a plurality of, i.e., two, channels and are biased by the drop voltages of the fourth and fifth transistors $Q_4$ and $Q_5$, respectively. Consequently, operating currents of the operational amplifiers $OP_1$ and $OP_2$ of the plurality of channels can be set simultaneously and accurately by way of the externally provided resistor 2.

In this instance, since a bias constant current flows between the current mirror circuit CM and the bias voltage generating fourth and fifth transistors $Q_4$ and $Q_5$, the degree of freedom in layout against noises is increased.

It is to be noted that, while MOS FETs are employed in the bias voltage generating circuit and the operational amplifier circuit described above, bipolar transistors can naturally be employed in place of such MOS FETs.

Further, it is also possible to construct the first operational amplifier $OP_1$ (or the second operational amplifier $OP_2$) from a plurality of operational amplifiers wherein constant-current source FETs are biased commonly.

Having now fully described the invention, it will be apparent to one of ordinary skill in the art that many changes and modifications can be made thereto without departing from the spirit and scope of the invention as set forth herein.

What is claimed is:

1. A bias voltage generating circuit, comprising a current mirror circuit including a diode-connected first transistor of a first conduction type and second and third transistors of the first conduction type, each having a source and a gate, the sources and gates of said first, second and third transistors connected together, bias voltage generating fourth and fifth transistors of a second conduction type which is different from the first conduction type, said fourth and fifth transistors having input drain electrodes connected to output source electrodes of said second and third transistors of said current mirror circuit, respectively, said first to third transistors of said current mirror circuit and said bias voltage generating fourth and fifth transistors being formed on a single chip semiconductor substrate as a semiconductor integrated circuit, said integrated circuit having an input terminal connected to an input electrode of said first transistor, a resistor provided outside said integrated circuit and connected to said input terminal for supplying a predetermined bias current therethrough to said input terminal of said integrated circuit, a first voltage $V_B$ connected to said resistor, a first and a second voltage Vcc connected to said fourth and fifth transistors, a first output terminal connected to a gate of said fourth transistor and a second output terminal connected to a gate of said fifth transistor.

2. A bias voltage generating circuit, comprising a current mirror circuit including a diode-connected first transistor of a first conduction type and second and third transistors of the first conduction type, each having a source and a gate, the sources and gates of said first, second and third transistors connected together, bias voltage generating fourth and fifth transistors of a second conduction type which is different from the first conduction type, said fourth and fifth transistors having input drain electrodes connected to output source electrodes of said second and third transistors of said current mirror circuit, respectively, said first to third transistors of said current mirror circuit and said bias voltage generating fourth and fifth transistors being formed on a single chip semiconductor substrate as a semiconductor integrated circuit, said integrated circuit having an input terminal connected to an input electrode of said first transistor, a resistor provided outside said integrated circuit and connected to said input terminal for supplying a predetermined bias current therethrough to said input terminal of said integrated circuit, a first voltage $V_B$ connected to said resistor, a first and a second voltage Vcc connected to said fourth and fifth transistors, a first output terminal connected to a gate of said fourth transistor and a second output terminal connected to a gate of said fifth transistor, a first operational amplifier including a first constant-current source transistor connected to the gate of said fourth transistor, and a second operational amplifier including a second constant-current source transistor connected to the gate of said fifth transistor, and said first and second operational amplifiers being formed on said single chip semiconductor substrate.

* * * * *